United States Patent
Sahin et al.

(10) Patent No.: US 12,199,582 B2
(45) Date of Patent: Jan. 14, 2025

(54) DIGITAL COMMUNICATION SYSTEMS AND ASSOCIATED METHODS

(71) Applicant: Maxim Integrated Products, Inc., San Jose, CA (US)

(72) Inventors: Hakki Volkan Sahin, Ben Lomond, CA (US); Roberto Alini, Dublin, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 212 days.

(21) Appl. No.: 17/664,475

(22) Filed: May 23, 2022

(65) Prior Publication Data

US 2022/0407486 A1     Dec. 22, 2022

Related U.S. Application Data

(60) Provisional application No. 63/212,652, filed on Jun. 19, 2021.

(51) Int. Cl.
| | |
|---|---|
| *H03H 1/00* | (2006.01) |
| *H01F 27/42* | (2006.01) |
| *H03H 11/48* | (2006.01) |

(52) U.S. Cl.
CPC ......... *H03H 1/0007* (2013.01); *H01F 27/425* (2013.01); *H03H 11/486* (2013.01)

(58) Field of Classification Search
CPC ...... H02M 1/0009; H02M 1/00; H02M 3/156; H02M 1/12; H02M 3/33523; H02M 1/08; H02M 1/44; H02M 5/293; H01F 27/28; H01F 27/425; H01F 19/08; H03F 1/0283; H03F 1/565; H03F 2200/03; H03F 2200/189; H03F 2200/321; H03F 2200/351; H03F 2203/21142; H03F 3/183; H03F 3/187; H03F 3/211; H03F 3/217; H03F 3/2173

See application file for complete search history.

(56) References Cited

U.S. PATENT DOCUMENTS

| | | |
|---|---|---|
| 4,767,980 A | 8/1988 | Chen et al. |
| 5,399,944 A | 3/1995 | Konopka et al. |
| 7,683,704 B2 | 3/2010 | Op De Beeck |
| 2004/0051499 A1* | 3/2004 | Kameda ................. G05B 19/19 320/104 |
| 2009/0102548 A1* | 4/2009 | Op De Beeck ...... H03H 11/486 327/594 |
| 2018/0183262 A1* | 6/2018 | Tian ..................... H02J 7/00711 |

FOREIGN PATENT DOCUMENTS

WO     0149012 A1     7/2001

* cited by examiner

*Primary Examiner* — Lincoln D Donovan
*Assistant Examiner* — Tyler J Pereny
(74) *Attorney, Agent, or Firm* — PdZ Patent Law, PLLC

(57) ABSTRACT

A digital communication station includes a coupled inductor, driver circuitry, and a digital transceiver. The coupled inductor includes (1) a first winding connected between a first digital communication node and a first power node, (2) a second winding connected between a second digital communication node and a second power node, and (3) a third winding. The driver circuitry is configured to drive the third winding to increase respective inductance values of the first and second windings, and the digital transceiver is communicatively coupled to the first digital communication node and the second digital communication node.

20 Claims, 7 Drawing Sheets

DIGITAL COMMUNICATION SYSTEMS AND ASSOCIATED METHODS

RELATED APPLICATIONS

This application claims benefit of priority to U.S. Provisional Patent Application Ser. No. 63/212,652, filed on Jun. 19, 2021, which is incorporated herein by reference.

BACKGROUND

Digital communication systems are used in many applications, including, but not limited to, remote control of equipment. For example, a climate control system, such as for heating and/or cooling a building or other structure, may include a digital communication system for transmitting data between a climate control device and a remote-control device. Digital communication systems are also frequently configured to transmit electrical power as well as data. For example, in the climate control system discussed above, the digital communication system may also provide electrical power from the climate control device to the remote-control device, such as for powering the remote-control device.

Electrical power is conventionally transmitted in a digital communication system via dedicated electrical wires. For example, in the climate control system discussed above, an electrical cable connecting the climate control device and the remote-control device may include four electrical wires. Two of the wires may be used to transmit data, and the other two wires may be used to transmit electrical power. However, use of dedicated electrical wires for transmitting electrical power in a digital communication system may be expensive, particularly in applications where the wires must traverse a long distance. Additionally, inclusion of dedicated power transmission electrical wires in a cable will increase the cable's diameter, relative to an electrical cable without the dedicated electrical wires. An electrical cable with a large diameter may be difficult to install, particularly in retrofit applications where there is a limited space for the electrical cable.

DETAILED DESCRIPTION OF THE EMBODIMENTS

Figure 1:
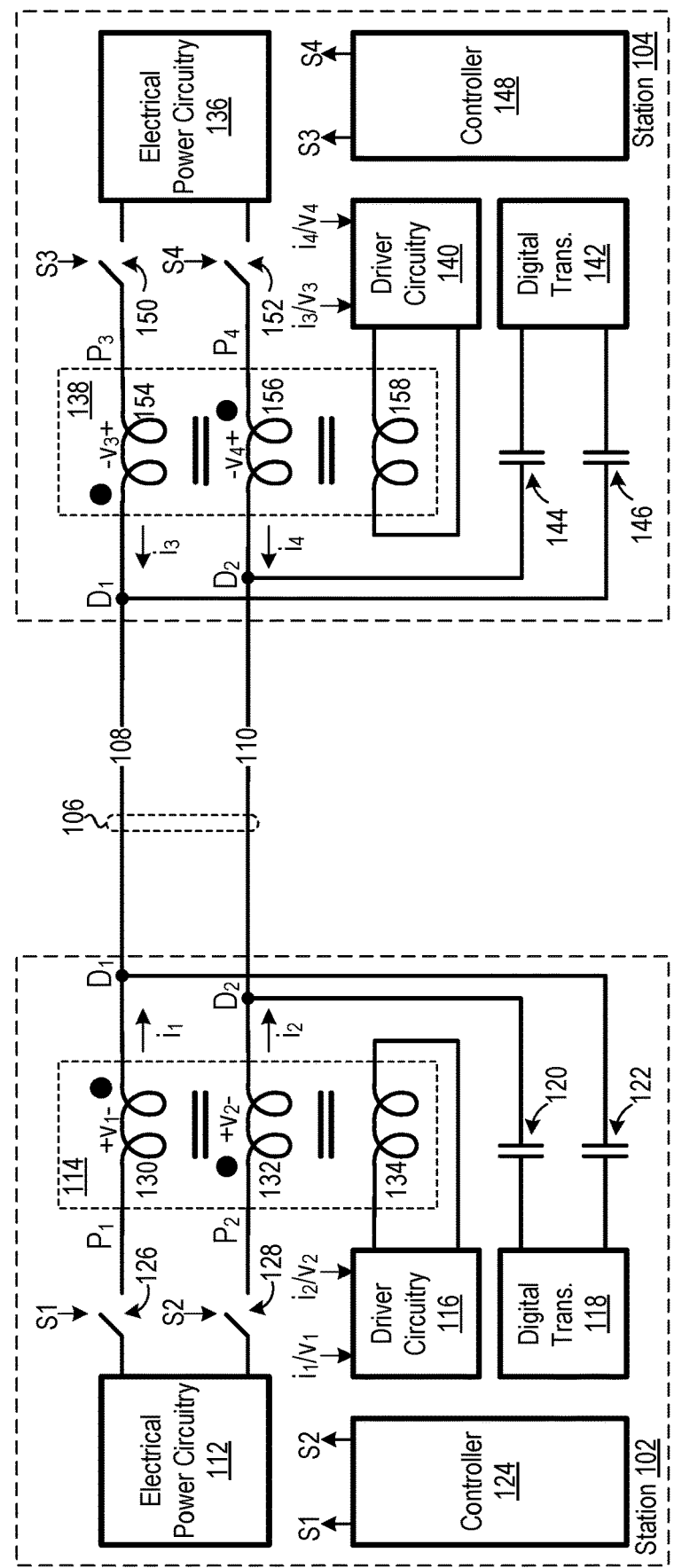
FIG. 1 is a block diagram of a digital communication system, according to an embodiment.

It is possible to use a single pair of electrical wires to transmit both data and electrical power in a digital communication system. However, communication signals traversing the wires must be isolated from electrical power circuitry connected to the wires, to prevent loading of the communication signals by the electrical power circuitry. Additionally, communication circuitry connected to the wires may need to be isolated from the electrical power circuitry to prevent the electrical power circuitry from interfering with operation of the communication circuitry.

Inductors or coupled inductors may be used to isolate electrical power circuitry from communication circuitry in a digital communication system. In particular, inductors or coupled inductors may be used to supply direct current (DC), or low frequency alternating current (AC), from the electrical power circuitry to a pair of electrical wires, while blocking transmission of high frequency AC communication signals between the electrical power circuitry and the pair of electrical wires. However, the inductors or coupled inductors will need to be relatively large and/or expensive to operate with DC or low frequency AC commonly used for electrical power transmission. Accordingly, while inductors and coupled inductors may be used to enable a single pair of electrical wires to transmit data and electrical power in a digital communication system, conventional use of inductors and coupled inductors has significant downsides.

Disclosed herein are digital communication systems and associated methods which at least partially overcome the above discussed drawbacks of conventional digital communication systems. The new digital communication systems enable use a single pair of electrical wires (or other electrical conductors) for data transmission and electrical power transmission. However, the new digital communication systems advantageously do not require large inductors or coupled inductors. Instead, the new digital communication systems include relatively small coupled inductors to isolate digital communication signals from electrical power circuitry.

The new digital communication systems further include driver circuitry configured to drive a third winding of each coupled inductor to increase effective inductance of first and second windings of the coupled inductor. For example, the driver circuitry may be configured to drive the third winding of the coupled inductor such that it generates a magnetic flux in the coupled inductor that impedes change of current magnitude through the first and second windings of the coupled inductor, thereby effectively increasing inductance of the first and second windings. Consequently, the new digital communication systems can achieve high performance with significantly smaller and/or cheaper magnetic devices than conventional digital communication systems having the same power rating. Stated differently, the coupled inductors of the new digital communication systems may be significantly smaller and/or cheaper than inductors and coupled inductors of a conventional digital communication system, where the two digital communication systems have the same power rating. Such difference in magnetic device size and/or cost may be particularly advantageous in high-current applications where inductors and coupled inductors of conventional digital communication systems would need to be unduly large to handle required current magnitude. Accordingly, certain embodiments of the new digital communication systems may support higher power levels than conventional digital communication systems. Additionally, the new digital communication systems may achieve better signal integrity than conventional digital communication systems.

Furthermore, some embodiments of the new digital communication systems are capable of bidirectional transfer of electrical power. Moreover, certain embodiments include protection features to help ensure safe and reliable operation. For example, some embodiments are configured to interrupt flow of electrical current, such as flow of electrical current through coupled inductor windings and/or electrical wires connecting digital communication system stations, in response to a fault. Examples of such fault include, but not limited to, a short-circuit condition, an over-current condition, an over-temperature condition, and/or a reverse polarity condition. Additionally, particular embodiments are configured to provide inrush current protection, such as by limiting a slew rate of electrical current flowing through coupled inductor windings and/or electrical wires of the digital communication system, during start-up of the digital communication system.

FIG. 1 is a block diagram of a digital communication system 100, which is one embodiment of the new digital communication systems disclosed herein. Digital communication system 100 includes a first station 102, a second station 104, and an electrical cable 106 connecting the first and second stations. Electrical cable 106 includes a first electrical wire 108 and a second electrical wire 110. However, each of first and second electrical wires 108 and 110 could be replaced with a different type of electrical conductor without departing from the scope hereof. As discussed below, digital communication system 100 is configured such that electrical cable 106 performs dual functions, i.e., it transmits data and provides electrical power.

Station 102 includes electrical power circuitry 112, a coupled inductor 114, driver circuitry 116, a digital transceiver 118, isolation capacitors 120 and 122, and a controller 124. Station 102 optionally further includes one or more of a switching device 126 and a switching device 128. Electrical power circuitry 112 is configured to perform one or more of the following two functions: (1) supply electrical power to electrical cable 106 via power nodes $P_1$ and $P_2$ and coupled inductor 114, and (b) receive electrical power from electrical cable 106 via power nodes $P_1$ and $P_2$ and coupled inductor 114. The configuration of power electrical power circuitry 112 will depend on the implementation of digital communication system 100. For example, in embodiments of digital communication system 100 configured such that electrical power flows in a single direction from station 102 to station 104, electrical power circuitry 112 may be configured to solely supply electrical power to electrical cable 106. On the other hand, in embodiments of digital communication system 100 configured such that electrical power flows in a single direction from station 104 to station 102, electrical power circuitry 112 may be configured to solely receive electrical power from electrical cable 106, e.g., for powering elements of station 102. Furthermore, in embodiments of digital communication system 100 configured for bidirectional electrical power flow between stations 102 and 104, electrical power circuitry 112 may be configured to either supply electrical power to electrical cable 106 or receive electrical power from electrical cable 106, depending on the operating state of digital communication system 100. Although electrical power circuitry 112 is symbolically shown as a single device, electrical power circuitry 112 may include multiple constituent elements that need not be commonly packaged.

Electrical power circuitry 112 is connected to power nodes $P_1$ and $P_2$ via switching devices 126 and 128, respectively. In embodiments where switching devices 126 and 128 are omitted, electrical power circuitry 112 is directly connected to power nodes $P_1$ and $P_2$. Coupled inductor 114 includes a first winding 130, a second winding 132, and third winding 134. Each of first winding 130, second winding 132, and third winding 134 are magnetically coupled, such as by a magnetic core of coupled inductor 114, which is symbolically shown in FIG. 1 by solid horizontal lines between adjacent windings.

Switching devices 126 and 128 are configured to control flow of electrical current between electrical power circuitry 112 and first and second windings 130 and 132, respectively, in response to control respective controls signals S1 and S2 generated by controller 124. For example, some embodiments of controller 124 are configured to generate control signals S1 and S2 to cause switching devices 126 and/or 128 to interrupt flow of electrical current through windings 130 and 132 in response to a fault condition. Examples of such fault condition include, but are not limited to, one or more of a short circuit condition, an over-current condition, an over-temperature condition (e.g., within station 102 or near station 102), a reverse-polarity condition, and a reverse-power condition. Additionally, some embodiments of controller 124 are configured to generate control signals S1 and S2 to provide inrush current protection by causing switching devices 126 and/or 128 to limit a slew rate of current flowing through the first and second windings 130 and 132 during start-up of digital communication system 100. Furthermore, certain embodiments of controller 124 are configured to generate control signals S1 and S2 to cause one or more of switching devices 126 and 128 to emulate a diode, such as to limit flow of electrical current to a single direction. Each switching device 126 and 128 includes, for example, one or more transistors, such as a field effect transistor (FET) or a bipolar junction transistor (BJT). One or more of switching devices 126 and 128 could be replaced with an alternative current control device, such as a diode, without departing from the scope hereof.

Winding 130 is connected between power node $P_1$ and a digital communication node $D_1$, and winding 132 is connected between power node $P_2$ and a digital communication node $D_2$. Electrical wire 108 is part of digital communication node $D_1$, and electrical wire 110 is part of digital communication node $D_2$. Digital transceiver 118 is communicatively coupled to digital communication nodes $D_1$ and $D_2$ via isolation capacitors 120 and 122, respectively. Digital transceiver 118 is configured to perform one or more of the following functions: (1) transmit digital communication signals, e.g., to station 104, via first and second digital communication nodes $D_1$ and $D_2$ and (2) receive digital communication signals, e.g., from station 104, via digital communication nodes $D_1$ and $D_2$. Isolation capacitors 120 and 122 allow passage of AC communication signals while blocking passage of DC power signals.

Coupled inductor 114 isolates digital communication signals on digital communication nodes D1 and D2 from electrical power circuitry 112, thereby preventing electrical power circuitry 112 from loading the digital communication signals. Additionally, driver circuitry 116 is configured to drive third winding 134 to increase effective inductance values of first and second windings 130 and 132, thereby advantageously enabling coupled inductor 114 to be relatively small while still providing effective isolation. Specifically, driver circuitry 116 is configured to drive third winding 134 such that it generates a magnetic flux in coupled inductor 114 that impedes change of current magnitude through the first and second windings 130 and 132, thereby effectively increasing inductance of the first and second windings.

For example, some embodiments of driver circuitry 116 are configured to receive signals representing voltages $v_1$ and $v_2$ as inputs, where voltages $v_1$ and $v_2$ are voltages across windings 130 and 132, respectively. Voltages $v_1$ and $v_2$ are proportional to time-varying currents $i_1$ and $i_2$ through windings 130 and 132 respectively, and driver circuitry 116 is configured to drive third winding 134 in response to, e.g., in proportion to, magnitude of voltages $v_1$ and $v_2$ such that third winding 134 generates magnetic flux within coupled inductor 114 that decreases rate of change of currents $i_1$ and $i_2$, respectively, thereby increasing effective inductance of windings 130 and 132.

As another example, some other embodiments of driver circuitry 116 are configured to receive signals representing currents $i_1$ and $i_2$ as inputs, such as from current-sensing circuitry (not shown) electrically connected in series with each of windings 130 and 132. In these embodiments, driver circuitry 134 is configured to drive third winding 134 in response to, e.g., in proportion to, currents $i_1$ and $i_2$ such that third winding 134 generates magnetic flux within coupled inductor 114 which decreases rate of change of currents $i_1$ and $i_2$, respectively, thereby increasing effective inductance of windings 130 and 132.

The configuration of station 102 also promotes integrity of digital signals on digital communication nodes $D_1$ and $D_2$. In particular, actual inductance of windings 130 and 132 may be detrimental to integrity of digital signals on digital communication nodes $D_1$ and $D_2$. Inclusion of third winding 134 and driver circuitry 116 in station 102, however, enables actual inductance of windings 130 and 132 to be relatively low while still realizing large effective inductance of the windings, thereby enabling coupled inductor 114 to achieve strong isolation with minimal detrimental effect on signal integrity.

As discussed above, in embodiments of station 102 including switching devices 126 and 128, controller 124 is configured to generate control signals S1 and S2. Additionally, certain embodiments of controller 124 are configured to support digital transceiver 118, such as by performing modulation and/or demodulation of communication signals, error checking, data flow control, etc. Two or more elements of station 102 may be partially or fully combined without departing from the scope hereof. For example, in particular embodiments of station 102, two or more of controller 124, digital transceiver 118, and driver circuitry 116 are part of a common integrated circuit.

Station 104 includes electrical power circuitry 136, a coupled inductor 138, driver circuitry 140, a digital transceiver 142, isolation capacitors 144 and 146, and a controller 148. Station 104 optionally further includes one or more of a switching device 150 and a switching device 152. Electrical power circuitry 136 is analogous to electrical power circuitry 112 of station 102, and electrical power circuitry 136 is configured to perform one or more of the following two functions, depending on the implementation of digital communication system 100: (1) supply electrical power to electrical cable 106 via power nodes $P_3$ and $P_4$ and coupled inductor 138, and (b) receive electrical power from electrical cable 106 via power nodes $P_3$ and $P_4$ and coupled inductor 138. Although electrical power circuitry 136 is symbolically shown as a single device, electrical power circuitry 136 may include multiple constituent elements that need not be commonly packaged.

Electrical power circuitry 136 is connected to power nodes $P_3$ and $P_4$ via switching devices 150 and 152, respectively. In embodiments where switching devices 150 and 152 are omitted, electrical power circuitry 136 is directly connected to power nodes $P_3$ and $P_4$. Coupled inductor 138 includes a first winding 154, a second winding 156, and third winding 158. First winding 154, second winding 156, and third winding 158 are magnetically coupled, such as by a magnetic core of coupled inductor 138, which is symbolically shown in FIG. 1 by solid horizontal lines between adjacent windings.

Switching devices 150 and 152 are configured to control flow of electrical current between electrical power circuitry 136 and first and second windings 154 and 156, respectively, in response to control respective controls signals S3 and S4 generated by controller 148. For example, some embodiments of controller 148 are configured to generate control signals S3 and S4 to cause switching devices 150 and/or 152 to interrupt flow of electrical current through windings 154 and 156 in response to a fault condition. Examples of such fault condition include, but are not limited to, one or more of a short circuit condition, an over-current condition, an over-temperature condition (e.g., within station 104 or near station 104), a reverse-polarity condition, and a reverse-power condition. Additionally, some embodiments of controller 148 are configured to generate control signals S3 and S4 to provide inrush current protection by causing switching devices 150 and/or 152 to limit a slew rate of current flowing through the first and second windings 154 and 156 during start-up of digital communication system 100. Furthermore, some embodiments of controller 148 are configured to generate control signals S3 and S4 to cause one or more of switching devices 150 and 152 to emulate a diode, such as to limit flow of electrical current to a single direction. Each switching device 150 and 152 includes, for example, one or more transistors, such as a FET or BJT. One or more of switching devices 150 and 152 could be replaced with an alternative current control device, such as a diode, without departing from the scope hereof.

Winding 154 is connected between power node $P_3$ and digital communication node $D_1$, and winding 156 is connected between power node $P_4$ and digital communication node $D_2$. Digital transceiver 142 is communicatively coupled to digital communication nodes $D_1$ and $D_2$ via isolation capacitors 144 and 146, respectively. Digital transceiver 142 is configured to perform one or more of the following functions: (1) transmit digital communication signals, e.g., to station 102, via first and second digital communication nodes $D_1$ and $D_2$, and (2) receive digital communication signals, e.g., from station 102, via digital communication nodes $D_1$ and $D_2$. Isolation capacitors 144 and 146 allow passage of AC communication signals while blocking passage of DC power signals.

Coupled inductor 138 isolates digital communication signals on digital communication nodes D1 and D2 from electrical power circuitry 136, thereby preventing electrical power circuitry 136 from loading the digital communication signals. Additionally, driver circuitry 140 is configured to drive third winding 158 to increase effective inductance values of first and second windings 154 and 156, thereby advantageously enabling coupled inductor 138 to be relatively small while still providing effective isolation. Specifically, driver circuitry 140 is configured to drive third winding 158 such that it generates a magnetic flux in coupled inductor 138 that impedes change of current magnitude through the first and second windings 154 and 156, thereby effectively increasing inductance of the first and second windings.

For example, some embodiments of driver circuitry 140 are configured to receive signals representing voltages $v_3$ and $v_4$ as inputs, where voltages $v_3$ and $v_4$ are voltages across windings 154 and 156, respectively. Voltages $v_3$ and $v_4$ are proportional to time-varying currents $i_3$ and $i_4$ through windings 154 and 156 respectively, and driver circuitry 140 is configured to drive third winding 158 in response to, e.g., in proportion to, magnitude of voltages $v_1$ and $v_2$ such that third winding 158 generates magnetic flux within coupled inductor 138 which decreases rate of change of currents $i_3$ and $i_4$, respectively, thereby increasing effective inductance of windings 154 and 156.

As another example, some other embodiments of driver circuitry 140 are configured to receive as inputs signals representing currents $i_3$ and $i_4$, such as from current-sensing circuitry (not shown) electrically connected in series with each of windings 154 and 156. In these embodiments, driver circuitry 140 is configured to drive third winding 158 in response to, e.g., in proportion to, currents $i_3$ and $i_4$ such that third winding 158 generates magnetic flux within coupled inductor 138 which decreases rate of change of currents $i_3$ and $i_4$, respectively, thereby increasing effective inductance of windings 154 and 156.

As discussed above, in embodiments of station 104 including switching devices 150 and 152, controller 148 is configured to generate control signals S3 and S4. Additionally, certain embodiments of controller 148 are configured to support digital transceiver 142, such as by performing modulation and/or demodulation of communication signals, error checking, data flow control, etc. Two or more elements of station 104 may be partially or fully combined without departing from the scope hereof. For example, in particular embodiments of station 104, two or more of controller 148, digital transceiver 142, and driver circuitry 140 are part of a common integrated circuit.

Figure 2:
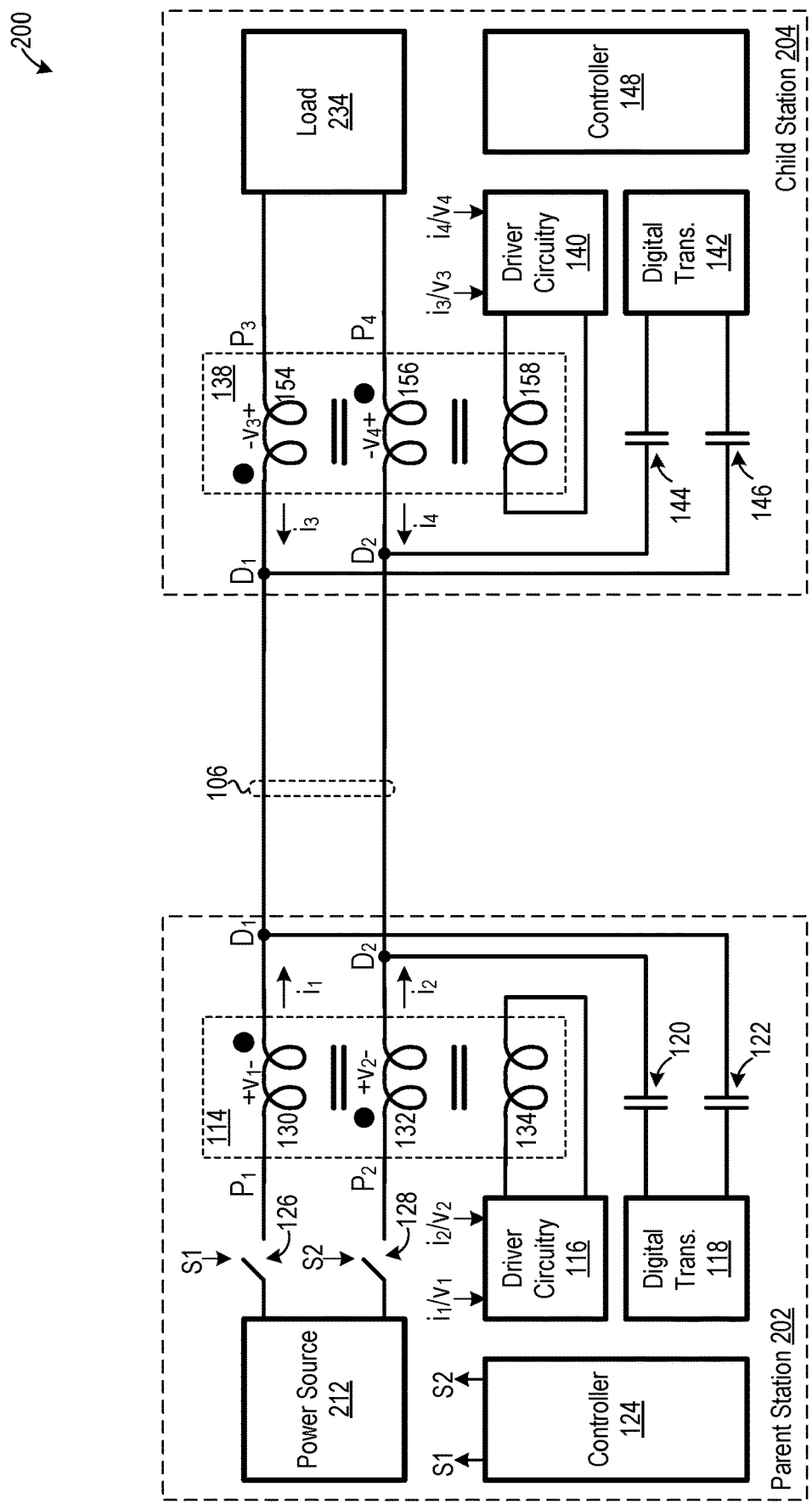
FIG. 2 is a block diagram of an embodiment of the FIG. 1 digital communication system including a parent station and a child station.

In some embodiments of digital communication system 100, stations 102 and 104 have the same configuration. In other embodiments of digital communication system 100, stations 102 and 104 have different respective configurations. For example, FIG. 2 is a block diagram of a digital communication system 200, which is an embodiment of digital communication system 100 including a parent station 202 and a child station 204. Parent station 202 is an embodiment of station 102 of FIG. 1 where electrical power circuitry 112 is implemented by a power source 212. Child station 204 is an embodiment of station 104 of FIG. 1 where electrical power circuitry 136 is implemented by an electrical load 234. Power source 212 is configured to provide electrical power to electrical cable 106 via power nodes $P_1$ and $P_2$ and coupled inductor 114, and electrical load 234 is configured to receive electrical power from electrical cable 106 via power nodes $P_3$ and $P_4$ and coupled inductor 138, such as for powering elements of child station 204. Accordingly, digital communication system 200 is configured for one-way transmission of electrical power from parent station 202 to child station 204, such that parent station 202 electrically powers child station 204.

Figure 3:
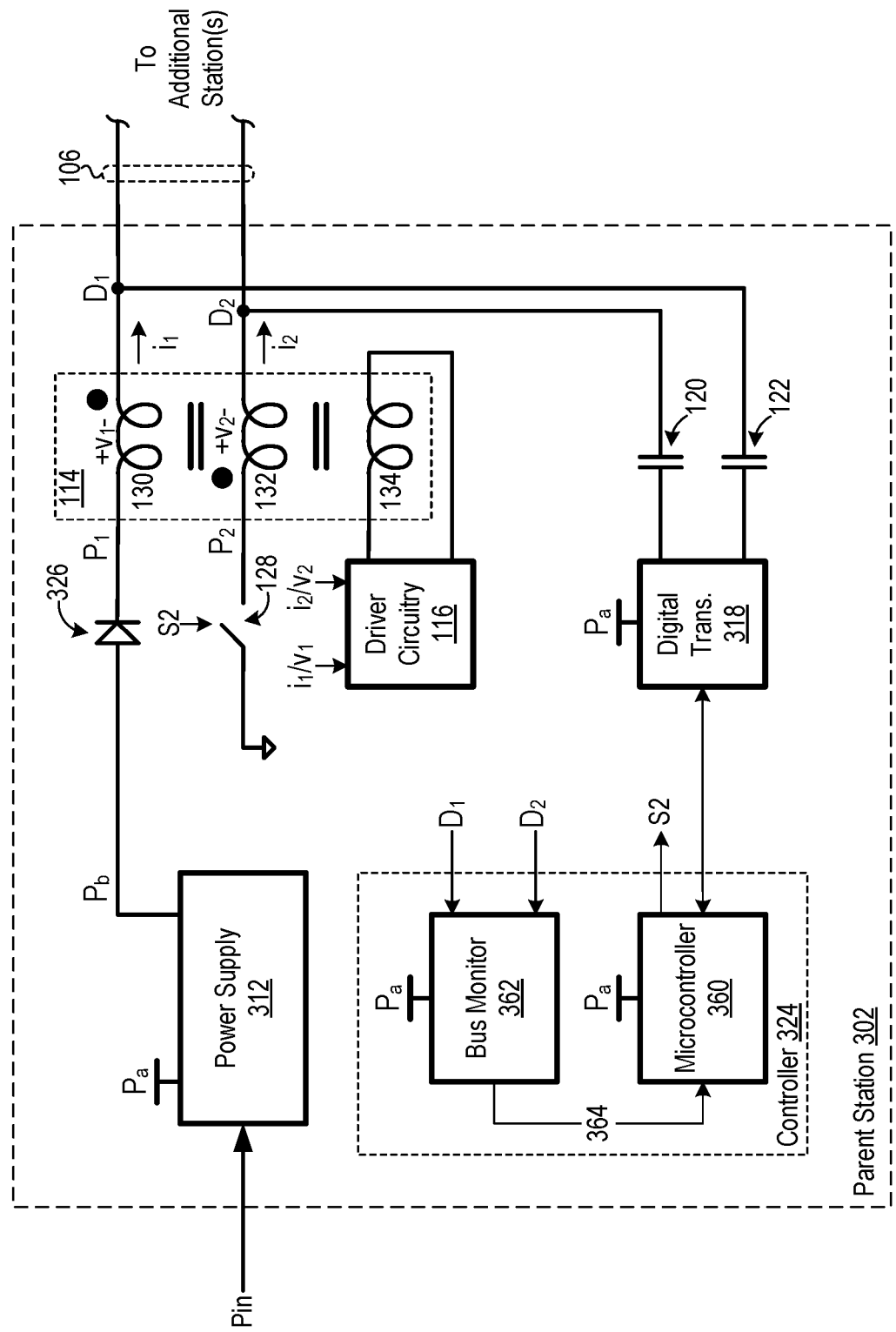
FIG. 3 is a block diagram of an embodiment of the parent station of FIG. 2.
Figure 4:
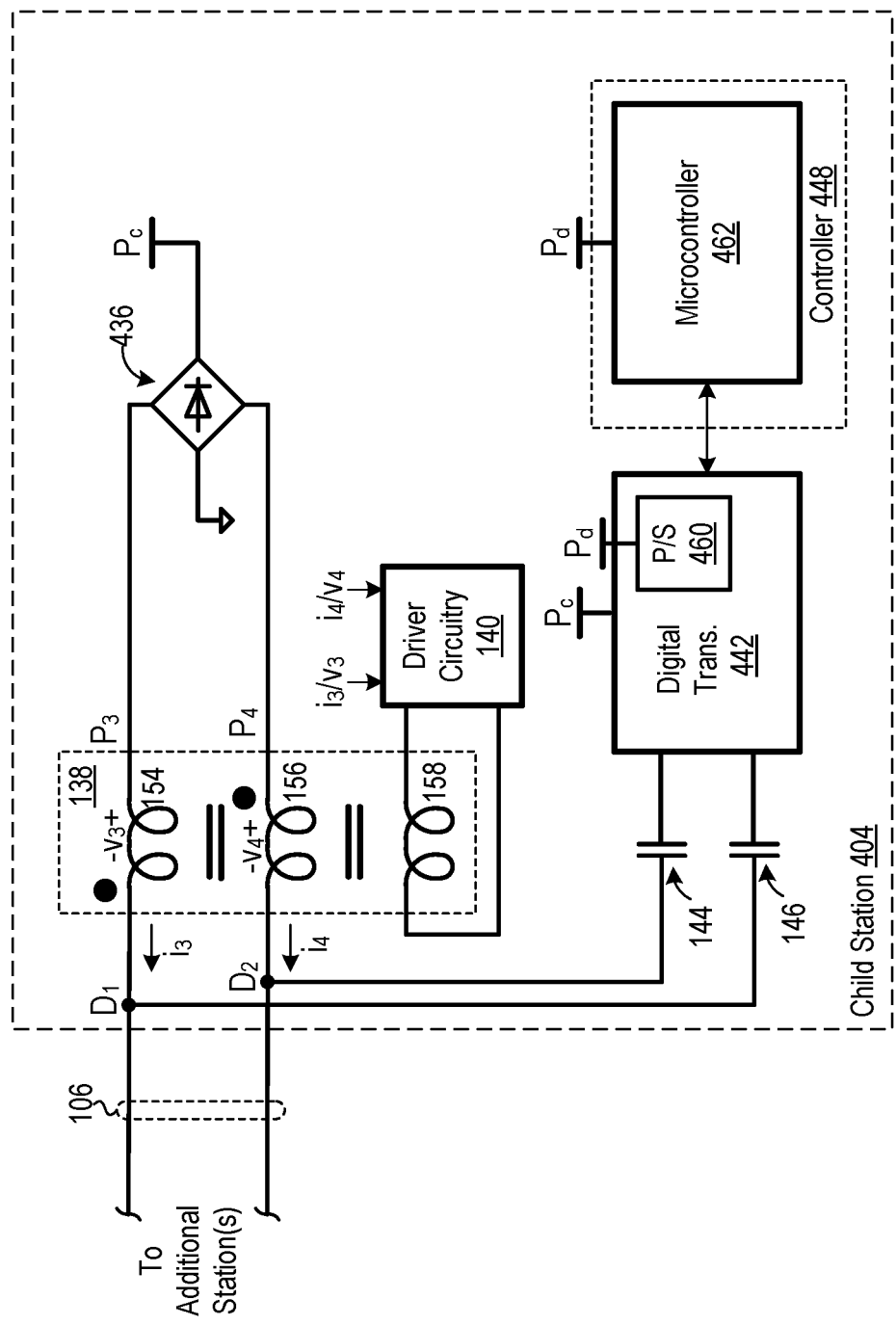
FIG. 4 is a block diagram of an embodiment of the child station of FIG. 2.

FIGS. 3 and 4 illustrate example implementations of parent station 202 and child station 204, respectively. However, it is understood that parent station 202 and child station 204 are not limited to these example implementations.

FIG. 3 is a block diagram of a parent station 302, which is an embodiment of parent station 202 of FIG. 2. Power supply 212, digital transceiver 118, and controller 124 of parent station 202 are respectively embodied by a power supply 312, a digital transceiver 318, and a controller 324, in parent station 302. Additionally, switching device 126 of parent station 202 is replaced with a diode 326 in parent station 302. Power supply 312 is configured to receive input electrical power $P_{in}$ and generate two power rails $P_a$ and $P_b$ therefrom. Power rail $P_b$ is coupled to first winding 130 via diode 326, such that power rail $P_b$ is used to provide electrical power to electrical cable 106. Power rail $P_a$ is used to power elements within parent station 302, such as digital transceiver 318 and controller 324.

Controller 324 includes a microcontroller 360 and a bus monitor 362 communicatively coupled to microcontroller 360. Microcontroller 360 is configured to support digital transceiver 318, such as by performing modulation and/or demodulation of communication signals, error checking, data flow control, etc. Microcontroller 360 is also configured to generate control signal S2, such as in response to bus data 364 from bus monitor 362. Bus monitor 362 is configured to generate bus data 364 representing state of digital communication nodes $D_1$ and $D_2$. In some embodiments, microcontroller 360 is configured to detect a fault from bus data 364 and cause switching device 128 to interrupt flow of current through windings 130 and 132 in response thereto. Additionally, some embodiments of microcontroller 360 are configured to generate control signal S2 to cause switching device 128 to limit slew rate of current flowing through windings 130 and 132 during start-up of digital communication system 200.

FIG. 4 is a block diagram of a child station 404, which is an embodiment of child station 204 of FIG. 2. Electrical load 234, digital transceiver 142, and controller 148 of child station 204 are respectively implemented by rectifier circuitry 436, digital transceiver 442, and controller 448, in child station 404. Additionally, switching devices 150 and 152 are omitted from child station 104. Rectifier circuitry 436 is configured to receive electrical power from electrical cable 106 via coupled inductor 138, and rectifier circuitry 436 is configured to generate a power rail $P_c$ from the received electrical power. Digital transceiver 442 includes a power supply (P/S) 460 configured to generate a power rail $P_d$ from power rail $P_c$. Power supply 460 is, for example, a linear regulator or a switching regulator. Digital transceiver 442 is optionally at least partially powered from power rail $P_d$. Controller 448 includes a microcontroller 462 that is powered from power rail $P_d$. Microcontroller 462 is configured to support digital transceiver 442, such as by performing modulation and/or demodulation of communication signals, error checking, data flow control, etc.

Figure 5:
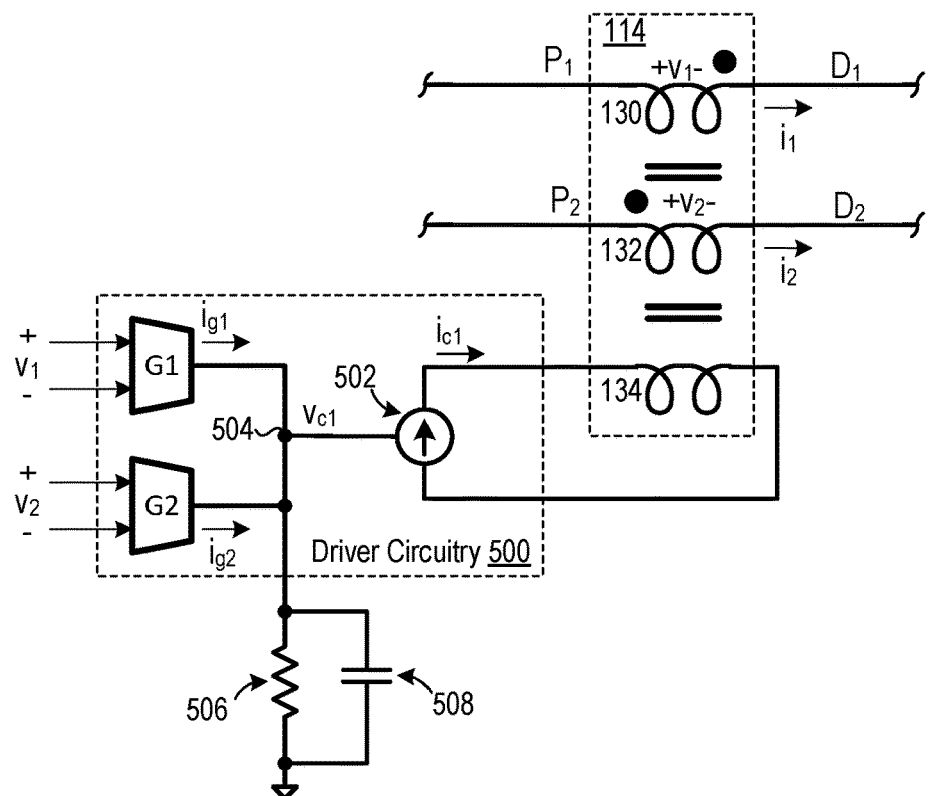
FIG. 5 is a block diagram of driver circuitry connected to a coupled inductor, according to an embodiment.

FIG. 5 is a block diagram of driver circuitry 500 connected to coupled inductor 114, where driver circuitry 500 is one possible embodiment of driver circuitry 116 of FIGS. 1, 2, and 3. Driver circuity 500 includes a transconductance amplifier G1, a transconductance amplifier G2, and a current source 502. Transconductance amplifier G1 is configured to amplify voltage $v_1$ across first winding 130 to generate a current signal $i_{g1}$ flowing into an integration node 504. Transconductance amplifier G2 is configured to amplify voltage $v_2$ across second winding 132 to generate a current signal $i_{g2}$ flowing into integration node 504. A resistor 506 and capacitor 508 are connected to integration node 504 to form an integration network, and the integration network integrates current signals $i_{g1}$ and $i_{g2}$ to generate a voltage control signal $v_{c1}$ on integration node 504. Current source 502 is connected in series with third winding 134, and current source 502 drives third winding 134 with a current $i_{c1}$ having a magnitude that is proportional to voltage control signal $v_{c1}$. Accordingly, driver circuitry 500 drives third winding 134 in proportion to voltages $v_1$ and $v_2$.

Although resistor 506 and capacitor 508 are illustrated as being external to driver circuitry 500, one or more of these elements could instead be integrated with driver circuitry 500. Additionally, resistor 506 and/or capacitor 508 could be supplemented with, or replaced by, one or more other elements configured to integrate current signals $I_{g1}$ and $I_{g2}$.

Connections between windings 130 and 132 and transconductance amplifiers G1 and G2 are not shown in FIG. 5 for illustrative clarity.

Figure 6:
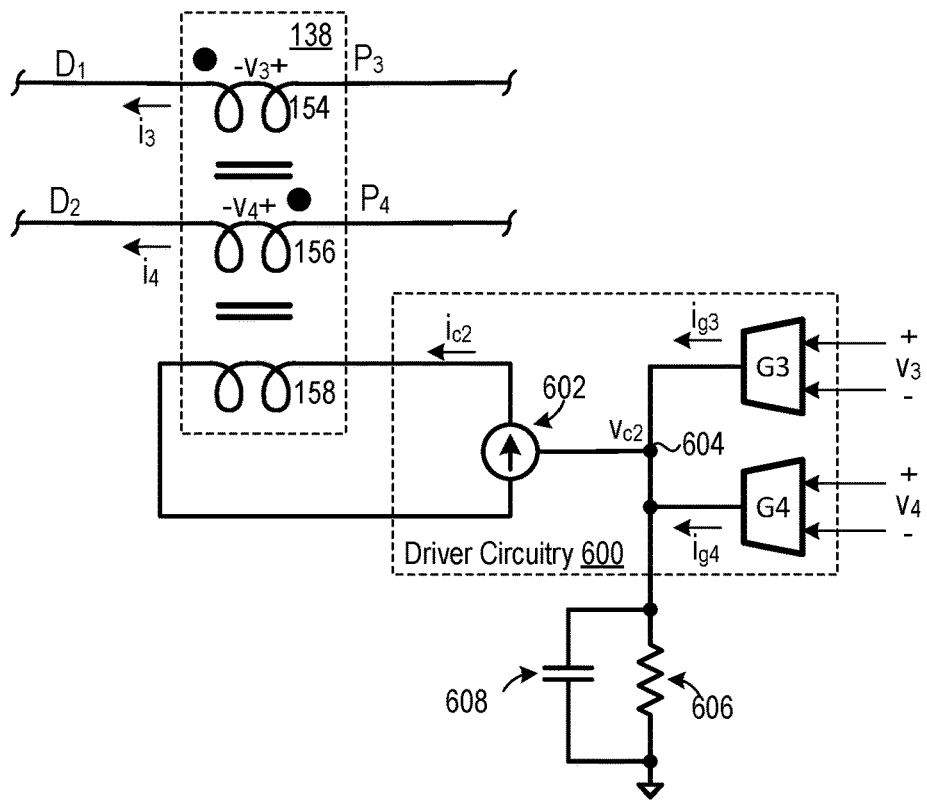
FIG. 6 is another block diagram of driver circuitry connected to a coupled inductor, according to an embodiment.

FIG. 6 is a block diagram of driver circuitry 600 connected to coupled inductor 138, where driver circuitry 600 is one possible embodiment of driver circuitry 140 of FIGS. 1, 2, and 4. Driver circuity 600 includes a transconductance amplifier G3, a transconductance amplifier G4, and a current source 602. Transconductance amplifier G3 is configured to amplify voltage $v_3$ across first winding 154 to generate a current signal $i_{g3}$ flowing into an integration node 604. Transconductance amplifier G4 is configured to amplify voltage $v_4$ across second winding 156 to generate a current signal $i_{g4}$ flowing into integration node 604. A resistor 606 and capacitor 608 are connected to integration node 604 to form an integration network, and the integration network integrates current signals $i_{g3}$ and $i_{g4}$ to generate a voltage control signal $v_{c2}$ on integration node 604. Current source 602 is connected in series with third winding 158, and current source 602 drives third winding 158 with a current $i_{c2}$ having a magnitude that is proportional to voltage control signal $v_{c2}$. Accordingly, driver circuitry 600 drives third winding 158 in proportion to voltages $v_3$ and $v_4$.

Although resistor 606 and capacitor 608 are illustrated as being external to driver circuitry 600, one or more of these elements could instead be integrated with driver circuitry 600. Additionally, resistor 606 and/or capacitor 608 could be supplemented with, or replaced by, one or more other elements configured to integrate current signals $i_{g3}$ and $i_{g4}$. Connections between windings 154 and 156 and transconductance amplifiers G3 and G4 are not shown in FIG. 6 for illustrative clarity.

Figure 7:
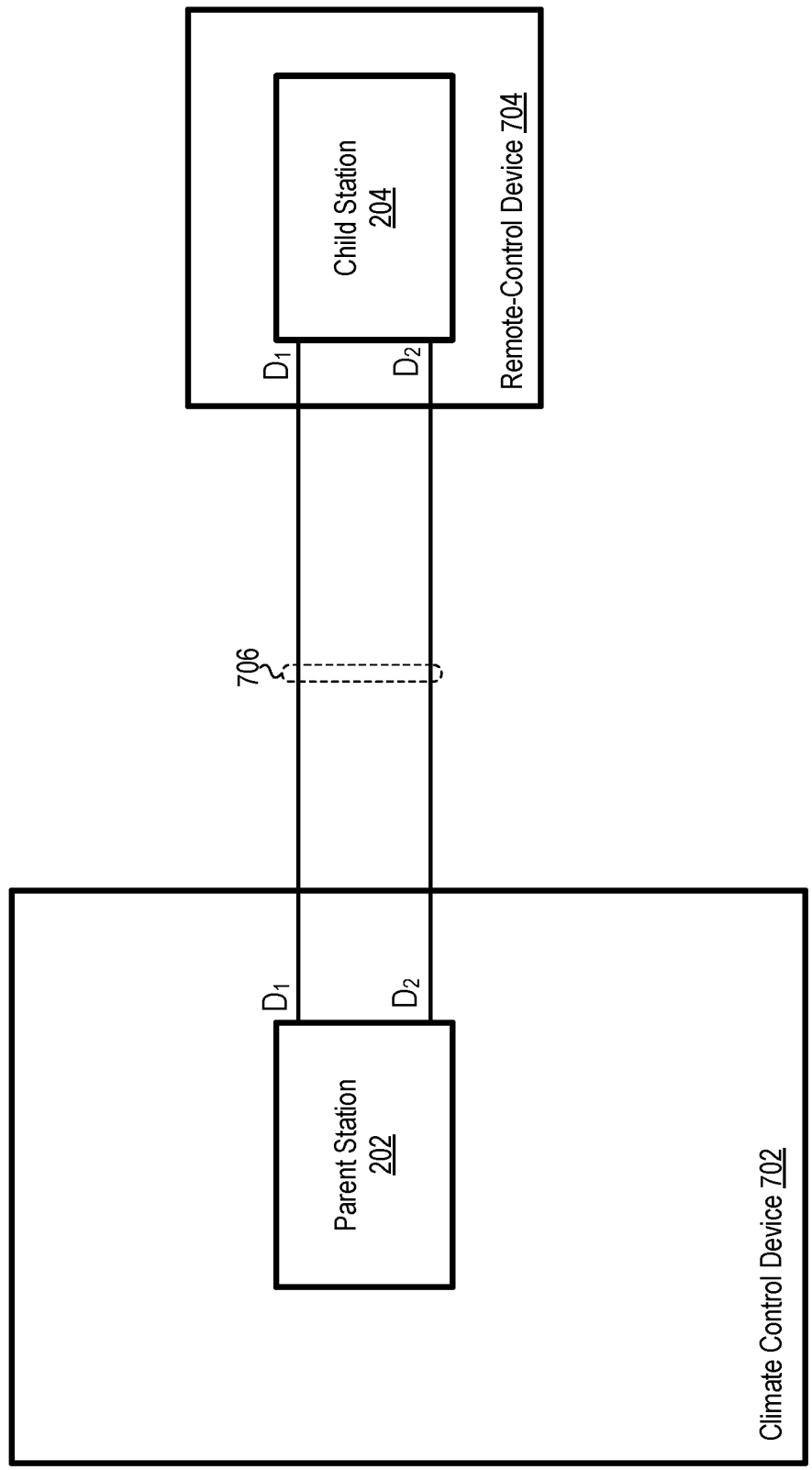
FIG. 7 is a block diagram including an instance of the FIG. 2 digital communication system in a climate control system, according to an embodiment.

Referring again to FIG. 1, the digital communication systems disclosed herein could be used in essentially an application where it is desired to transmit data and electrical power over a common pair of electrical wires. Example applications of the digital communication systems include, but are not limited to, industrial applications, building automation applications, climate control applications, communications applications, automotive applications, healthcare applications, aircraft applications, energy production applications, security applications, utility applications, traffic control applications, etc. For example, FIG. 7 is a block diagram of a climate control system 700 including an instance of digital communication system 200 of FIG. 2. Climate control system 700 includes a climate control device 702, a remote-control device 704, and an electrical cable 706. Climate control device 702 is configured to control a climate of a building or other structure, such as by heating and/or cooling the building or other structure. Climate control device 702 includes an instance of parent station 202 of FIG. 2. Remote-control device 704 includes an instance of child station 204, and remote-control device 704 is configured to at least partially control operation of climate control device 702. For example, some embodiments of remote-control device 704 are configured to control an operating mode and/or temperature setpoint of climate control device 702. Electrical cable 706, which is an embodiment of electrical cable 106, connects parent station 202 and child station 204, and electrical cable 706 is accordingly configured to transmit data between climate control device 702 and remote-control device 704. Additionally, electrical cable 706 is configured to carry electrical power from climate control device 702 to remote-control device 704, such that climate control device 702 electrically powers remote-control device 704.

Figure 8:
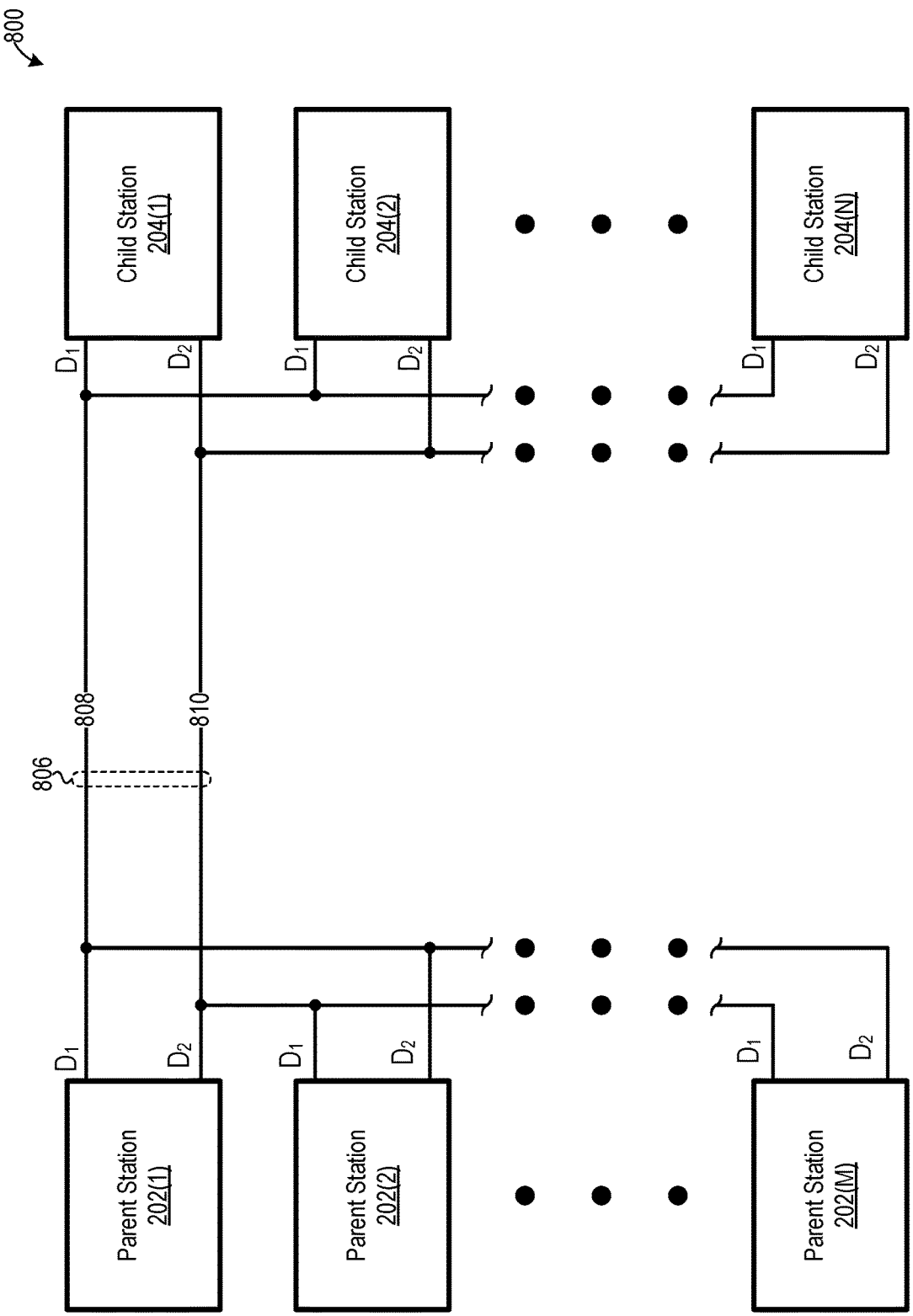
FIG. 8 is a block diagram of a digital communication system including a plurality of stations, according to an embodiment.

The digital communication systems disclosed herein are not limited to including two stations. To the contrary, the digital communication systems could be configured to include essentially any number of stations. For example, FIG. 8 is a block diagram of a digital communication system 800 including M instances of parent station 202 and N instances of child station 204. M and N are each positive integers, and M need not be equal to M. Electrical cable 806 connects all stations 202, 204 of communication system 800 in parallel, such that all stations share communication cable 806. Respective wires 808 and 810 of electrical cable 806 are part of first digital communication node $D_1$ and second digital communication node $D_2$, respectively. Details of stations 202 and 204 are not shown in FIG. 8 for illustrative clarity. In this document, specific instances of an item may be referred to by use of a numeral in parentheses (e.g. parent station 202(1)) while numerals without parentheses refer to any such item (e.g. parent stations 202). Any one of stations 202 and 204 of digital communication system 800 could be replaced with a different type of station without departing from the scope hereof.

Combinations of Features

Features described above may be combined in various ways without departing from the scope hereof. The following examples illustrate some possible combinations.

- (A1) A digital communication station includes a first coupled inductor, first driver circuitry, and a first digital transceiver. The first coupled inductor includes (1) a first winding connected between a first digital communication node and a first power node, (2) a second winding connected between a second digital communication node and a second power node, and (3) a third winding. The first driver circuitry is configured to drive the third winding to increase respective inductance values of the first and second windings, and the first digital transceiver is communicatively coupled to the first digital communication node and the second digital communication node.
- (A2) In the digital communication station denoted as (A1), the first driver circuitry may be configured to drive the third winding to increase respective inductance values of the first and second windings at least partially in response to current flowing through the first and second windings.
- (A3) In any one of the digital communication stations denoted as (A1) and (A2), the first driver circuitry may be configured to drive the third winding to increase respective inductance values of the first and second windings at least partially in response to (a) a voltage across the first winding and (b) a voltage across the second winding.
- (A4) Any one of the digital communication stations denoted as (A1) through (A3) may further include a controller configured to provide fault protection by causing flow of current through at least one of the first winding and the second winding to be interrupted in response to a fault condition.
- (A5) In the digital communication station denoted as (A4), the fault condition may be selected from the group consisting of a short circuit condition, an over-current condition, an over-temperature condition, a reverse-polarity condition, and a reverse-power condition.
- (A6) In any one of the digital communication stations denoted as (A4) and (A5), the controller may be further configured to provide inrush current protection by limiting a slew rate of current flowing through the first and second windings during start-up of the digital communication station.

(A7) In any one of the digital communication stations denoted as (A1) through (A6), the first digital communication node and the second digital communication node may be part of an electrical cable of a climate control system.

(A8) In any one of the digital communication stations denoted as (A1) through (A7) the first digital transceiver may be configured to perform at least one of the following actions (1) transmit digital communication signals via the first and second digital communication nodes and (2) receive digital communication signals via the first and second digital communication nodes.

(B1) A digital communication system includes a first station, a second station, and an electrical cable. The first station includes a first coupled inductor, first driver circuitry, and a first digital transceiver. The first coupled inductor includes a first winding connected between a first digital communication node and a first power node, a second winding connected between a second digital communication node and a second power node, and a third winding. The first driver circuitry is configured to drive the third winding of the first coupled inductor to increase respective inductance values of the first and second windings of the first coupled inductor, and the first digital transceiver is communicatively coupled to the first digital communication node and the second digital communication node. The second station includes a second coupled inductor, second driver circuitry, and a second digital transceiver. The second coupled inductor includes a first winding connected between the first digital communication node and a third power node, a second winding connected between the second digital communication node and a fourth power node, and a third winding. The second driver circuitry is configured to drive the third winding of the second coupled inductor to increase respective inductance values of the first and second windings of the second coupled inductor, and the second digital transceiver is communicatively coupled to the first digital communication node and the second digital communication node. The electrical cable connects (a) the first digital communication node between the first and second stations, and (b) the second digital communication node between the first and second stations.

(B2) In the digital communication system denoted as (B1), the first driver circuitry may be configured to drive the third winding of the first coupled inductor to increase respective inductance values of the first and second windings of the first coupled inductor at least partially in response to current flowing through the first and second windings.

(B3) In any one of the digital communication systems denoted as (B1) and (B2), the first driver circuitry may be configured to drive the third winding of the first coupled inductor to increase respective inductance values of the first and second windings of the first coupled inductor at least partially in response to (a) a voltage across the first winding and (b) voltage across the second winding.

(B4) In any one of the digital communication systems denoted as (B1) through (B3), the first station may further include a controller configured to provide fault protection in the digital communication system by causing flow of current through at least one of the first winding of the first coupled inductor and the second winding of the first coupled inductor to be interrupted in response to a first fault condition.

(B5) In the digital communication system denoted as (B4), the first fault condition may be selected from the group consisting of a short circuit, an over-current condition, an over-temperature condition, a reverse-polarity condition, and a reverse-power condition.

(B6) In any one of the digital communication systems denoted as (B1) through (B5), the first station may further include a controller configured to provide inrush current protection by limiting a slew rate of current flowing through the first and second windings of the first coupled inductor during start-up of the digital communication system.

(B7) In any one of the digital communication systems denoted as (B1) through (B6), the second station may further include a controller configured to provide fault protection in the digital communication system by causing flow of current through at least one of the first winding of the second coupled inductor and the second winding of the second coupled inductor to be interrupted in response to a second fault condition.

(B8) In the digital communication system denoted as (B7), the second fault condition may be selected from the group consisting of a short circuit, an over-current condition, an over-temperature condition, a reverse-polarity condition, and a reverse-power condition.

(B9) In any one of the digital communication systems denoted as (B1) through (B8), the second station further may further include a controller configured to provide inrush current protection by limiting a slew rate of current flowing through the first and second windings of the second coupled inductor during start-up of the digital communication system.

(B10) In any one of the digital communication systems denoted as (B1) through (B9), the digital communication system may be part of a climate control system.

(B11) In any one of the digital communication systems denoted as (B1) through (B10), the first and second power nodes may be connected to an electrical power source.

(B12) Any one of the digital communication systems denoted as (B1) through (B11) may further include an electrical load electrically coupled to the third power node and the fourth power node.

(B13) In any one of the digital communication systems denoted as (B1) through (B12), the first digital transceiver may be configured to transmit digital communication signals via the first and second digital communication nodes, and the second digital transceiver may be configured to receive digital communication signals via the first and second digital communication nodes.

(B14) In the digital communication system denoted as (B13), the first digital transceiver may be further configured to receive digital communication signals via the first and second digital communication nodes, and the second digital transceiver may be configured to transmit digital communication signals via the first and second digital communication nodes.

(B15) In any one of the digital communication systems denoted as (B1) through (B14), the digital communication system may be configured to permit bi-directional flow of electrical power between the first and second stations via the electrical cable.

(B16) Any one of the digital communication systems denoted as (B1) through (B15) may further a third station connected to the electrical cable, (C1) A method for transmitting digital data and electrical power in a digital communication system includes (1) providing electrical power to first and second digital communication nodes via first and second windings of a coupled inductor, (2) transmitting or receiving digital communication signals via the first and second digital communication nodes using a digital transceiver communicatively coupled to the first and second digital communication nodes, and (3) driving a third winding of the coupled inductor to increase respective inductance values of the first and second windings of the coupled inductor.

(C2) In the method denoted as (C1), driving the third winding of the coupled inductor to increase respective inductance values of the first and second windings of the coupled inductor may include driving the third winding at least partially in response to current flowing through the first and second windings.

(C3) In any one of the methods denoted as (C1) and (C2), driving the third winding of the coupled inductor to increase respective inductance values of the first and second windings of the coupled inductor may include driving the third winding at least partially in response to (a) a voltage across the first winding and (b) voltage across the second winding.

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which as a matter of language, might be said to fall therebetween.

What is claimed is:

1. A digital communication station, comprising:
    a first coupled inductor including:
        a first winding connected between a first digital communication node and a first power node,
        a second winding connected between a second digital communication node and a second power node, and
        a third winding;
    first driver circuitry configured to drive the third winding at least partially based on each of (i) a first signal representing one of a first voltage across the first winding and a first current through first winding and (ii) a second signal representing one of a second voltage across the second winding and a second current through the second winding, to increase respective inductance values of the first and second windings; and
    a first digital transceiver communicatively coupled to the first digital communication node and the second digital communication node.

2. The digital communication station of claim 1, wherein the first signal represents the first current through the first winding and the second signal represents the second current through the second winding.

3. The digital communication station of claim 1, wherein the first signal represents the first voltage across the first winding and the second signal represents the second voltage across the second winding.

4. The digital communication station of claim 1, further comprising a controller configured to provide fault protection by causing flow of current through at least one of the first winding and the second winding to be interrupted in response to a fault condition.

5. A digital communication station, comprising:
    a first coupled inductor including:
        a first winding connected between a first digital communication node and a first power node,
        a second winding connected between a second digital communication node and a second power node, and
        a third winding;
    first driver circuitry configured to drive the third winding to increase respective inductance values of the first and second windings;
    a first digital transceiver communicatively coupled to the first digital communication node and the second digital communication node; and
    a controller configured to provide inrush current protection by limiting a slew rate of current flowing through the first and second windings during start-up of the digital communication station.

6. The digital communication station of claim 1, where the first digital communication node and the second digital communication node are part of an electrical cable of a climate control system.

7. The digital communication station of claim 1, wherein the first digital transceiver is configured to perform at least one of the following actions:
    transmit digital communication signals via the first and second digital communication nodes; and
    receive digital communication signals via the first and second digital communication nodes.

8. A digital communication system, comprising:
    a first station, including:
        a first coupled inductor, including:
            a first winding connected between a first digital communication node and a first power node,
            a second winding connected between a second digital communication node and a second power node, and
            a third winding,
        first driver circuitry configured to drive the third winding of the first coupled inductor to increase respective inductance values of the first and second windings of the first coupled inductor, and
        a first digital transceiver communicatively coupled to the first digital communication node and the second digital communication node;
    a second station, including:
        a second coupled inductor, including:
            a first winding connected between the first digital communication node and a third power node,
            a second winding connected between the second digital communication node and a fourth power node, and
            a third winding,
        second driver circuitry configured to drive the third winding of the second coupled inductor to increase respective inductance values of the first and second windings of the second coupled inductor, and
        a second digital transceiver communicatively coupled to the first digital communication node and the second digital communication node;
    an electrical cable connecting (a) the first digital communication node between the first and second stations, and (b) the second digital communication node between the first and second stations.

9. The digital communication system of claim 8, wherein the first driver circuitry is configured to drive the third winding of the first coupled inductor to increase respective inductance values of the first and second windings of the first coupled inductor at least partially in response to current flowing through the first and second windings.

10. The digital communication system of claim 8, wherein the first driver circuitry is configured to drive the third winding of the first coupled inductor to increase respective inductance values of the first and second windings of the first coupled inductor at least partially in response to (a) a voltage across the first winding and (b) a voltage across the second winding.

11. The digital communication system of claim 8, wherein the first station further includes a controller configured to provide fault protection in the digital communication system by causing flow of current through at least one of the first winding of the first coupled inductor and the second winding of the first coupled inductor to be interrupted in response to a first fault condition.

12. The digital communication system of claim 8, wherein the first station further includes a controller configured to provide inrush current protection by limiting a slew rate of current flowing through the first and second windings of the first coupled inductor during start-up of the digital communication system.

13. The digital communication system of claim 8, wherein the second station further includes a controller configured to provide fault protection in the digital communication system by causing flow of current through at least one of the first winding of the second coupled inductor and the second winding of the second coupled inductor to be interrupted in response to a second fault condition.

14. The digital communication system of claim 8, wherein the digital communication system is part of a climate control system.

15. The digital communication system of claim 8, wherein the first and second power nodes are connected to an electrical power source.

16. The digital communication system of claim 15, further comprising an electrical load electrically coupled to the third power node and the fourth power node.

17. The digital communication system of claim 8, wherein:
    the first digital transceiver is configured to transmit digital communication signals via the first and second digital communication nodes; and
    the second digital transceiver is configured to receive digital communication signals via the first and second digital communication nodes.

18. The digital communication system of claim 17, wherein:
    the first digital transceiver configured to receive digital communication signals via the first and second digital communication nodes; and
    the second digital transceiver is configured to transmit digital communication signals via the first and second digital communication nodes.

19. The digital communication system of claim 8, wherein the digital communication system is configured to permit bi-directional flow of electrical power between the first and second stations via the electrical cable.

20. A method for transmitting digital data and electrical power in a digital communication system, the method comprising:
    providing electrical power to first and second digital communication nodes via first and second windings of a coupled inductor;
    transmitting or receiving digital communication signals via the first and second digital communication nodes using a digital transceiver communicatively coupled to the first and second digital communication nodes; and
    driving a third winding of the coupled inductor at least partially based on each of (i) a first signal representing one of a first voltage across the first winding and a first current through first winding and (ii) a second signal representing one of a second voltage across the second winding and a second current through the second winding, to increase respective inductance values of the first and second windings of the coupled inductor.

* * * * *